US011346858B1

(12) United States Patent
Kraft

(10) Patent No.: US 11,346,858 B1
(45) Date of Patent: May 31, 2022

(54) ELECTRICAL CIRCUIT BYPASS DEVICE

(71) Applicant: PRODUCT LINE DESIGNS LLC, Monument, CO (US)

(72) Inventor: Robert Alan Kraft, Monument, CO (US)

(73) Assignee: PRODUCT LINE DESIGN LLC, Monument, CO (US)

(*) Notice: Subject to any disclaimer, the term of this patent is extended or adjusted under 35 U.S.C. 154(b) by 0 days.

(21) Appl. No.: 17/330,882

(22) Filed: May 26, 2021

Related U.S. Application Data

(60) Provisional application No. 63/127,663, filed on Dec. 18, 2020.

(51) Int. Cl.
*G01R 1/04* (2006.01)
*H01R 25/00* (2006.01)
*H01R 13/05* (2006.01)

(52) U.S. Cl.
CPC ........... *G01R 1/0416* (2013.01); *H01R 25/00* (2013.01); *H01R 13/052* (2013.01); *H01R 2201/20* (2013.01)

(58) Field of Classification Search
CPC .......................... G01R 1/06788; G01R 15/125; G01R 1/0416; G01R 15/12; G01R 31/005; G01R 19/16561; G01R 1/00; G01R 1/0425; G01R 1/06; G01R 1/06711; G01R 1/22; G01R 31/28; H01R 2201/20; H01R 11/18; H01R 11/22
USPC ............. 324/754.03, 754.01, 754.02, 754.07
See application file for complete search history.

(56) References Cited

U.S. PATENT DOCUMENTS

| | | | | |
|---|---|---|---|---|
| 5,816,059 A | * | 10/1998 | Ficchi, Jr. ............ | G05B 19/048 62/127 |
| 7,079,040 B2 | * | 7/2006 | Barton ..................... | F24F 11/30 340/657 |
| 7,184,899 B2 | * | 2/2007 | Cruz .................... | G01R 15/125 702/57 |
| 7,298,136 B1 | | 11/2007 | Curtis | |
| 8,016,599 B1 | | 9/2011 | Melby et al. | |
| 8,358,121 B2 | * | 1/2013 | Hudson .................. | G08C 17/02 324/115 |
| 9,046,564 B1 | * | 6/2015 | Griffin .................... | G01R 31/20 |
| 9,618,535 B2 | | 4/2017 | Chait et al. | |
| 10,020,623 B1 | | 7/2018 | Meehan | |
| 10,135,212 B2 | * | 11/2018 | Meehan ................... | G01R 1/00 |
| 2006/0267608 A1 | * | 11/2006 | Faust ................. | G01R 1/06711 324/755.01 |
| 2015/0079811 A1 | | 3/2015 | Yi | |

* cited by examiner

*Primary Examiner* — Renee S Luebke
*Assistant Examiner* — Matthew T Dzierzynski
(74) *Attorney, Agent, or Firm* — Jacob M. Ward; Ward Law Office LLC

(57) ABSTRACT

An electrical testing device includes a housing having a base and a cover. The base and the cover define a cavity. The electrical testing device includes an input connector and a plurality of output connectors in electrical communication with the input connector. A fuse is in electrical communication with the input connector and the plurality of output connectors. The input connector and each output connector of the plurality of output connectors is adapted to connect to an interchangeable test lead. The input connector and each output connector of the plurality of output connectors is in electrical communication with an activation mechanism.

17 Claims, 9 Drawing Sheets

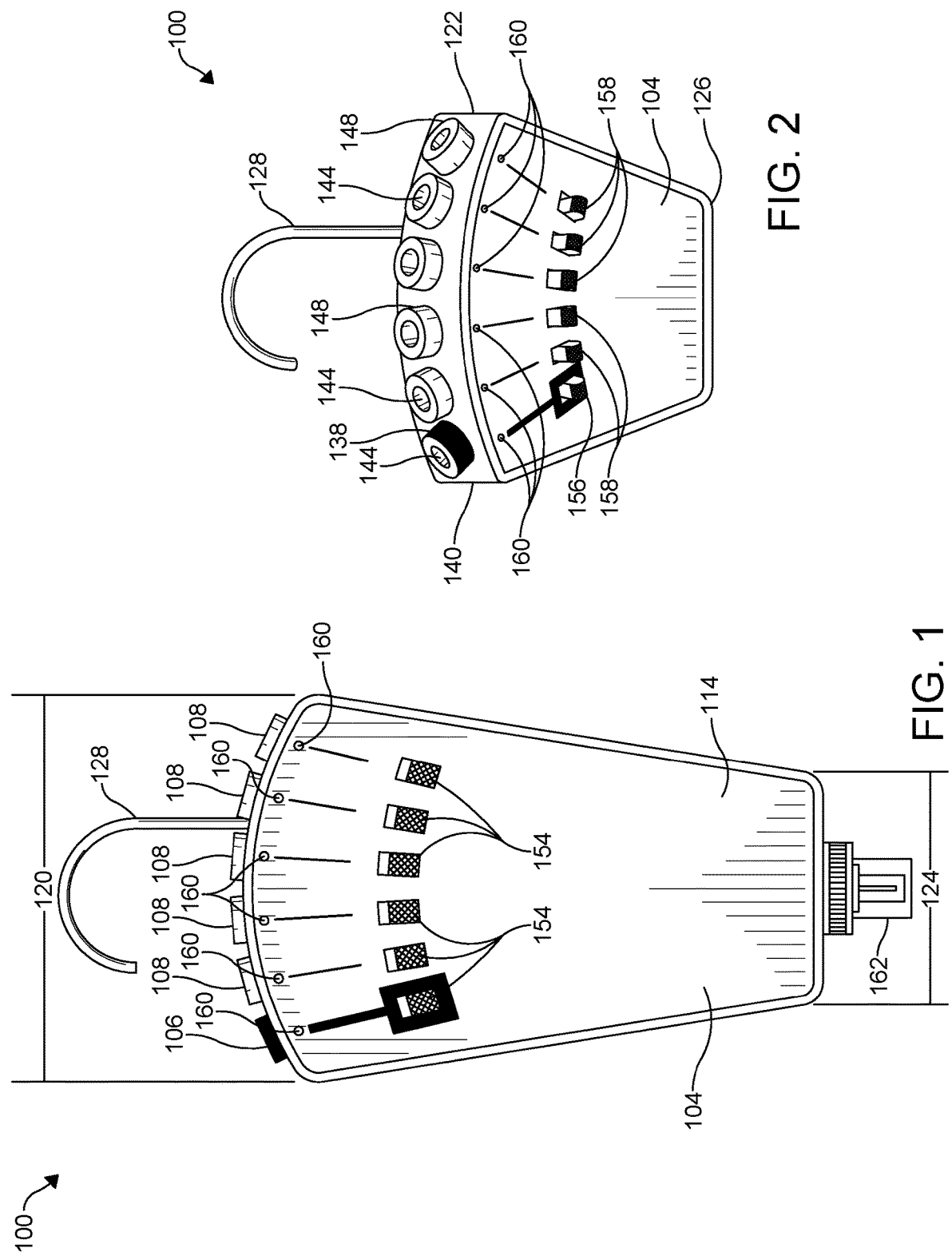

ELECTRICAL CIRCUIT BYPASS DEVICE

CROSS-REFERENCE TO RELATED APPLICATIONS

This application claims the benefit of U.S. Provisional Application Ser. No. 63/127,663, filed on Dec. 18, 2020. The entire disclosure of the above application is incorporated herein by reference.

FIELD

The present disclosure relates generally to an electrical testing device and, more specifically, to an electrical circuit bypass device used to bypass low voltage circuits for testing purposes.

INTRODUCTION

This section provides background information related to the present disclosure which is not necessarily prior art.

Electrical testing equipment is often used to troubleshoot electrical problems in both industrial and residential settings. Various testing instruments, such as multimeters, ohmmeters, and jumpers, may be used to determine whether electronic equipment, automobiles, appliances, and other devices are working properly.

In one example of known electrical testing equipment, as described in U.S. Pat. No. 8,016,599 to Melby et al., a magnetic jumper cable used to bypass electrical circuits includes a magnet disposed at each end of a wire. In another example, as described in U.S. Pat. No. 9,618,535 to Chait et al., a test instrument includes a point and a clamp action for gripping electrical components. In yet another example, as described in U.S. Pat. No. 10,135,212 to Meehan, an electric circuit jumper including electrical connectors, a coupling, and probes is used to bypass an electrical circuit.

Despite offering basic electrical testing and troubleshooting capabilities, many known devices work only in a limited set of circumstances, for example, with a specific system or terminal. Additionally, many known devices are not capable of testing multiple circuits independently from one another, and also simultaneously, as desired. Furthermore, it is possible for a user to short circuit a system during testing if an electrical testing device does not include components directed to preventing damage to the system. These known electrical testing devices can be difficult for a user to operate in situations where adjustments to the testing equipment would ideally be made.

There is a continuing need for a versatile electrical testing device that is capable of being used with various systems having a variety of terminals and in a multitude of settings. Desirably, the electrical testing device prevents damage to the system being tested and is easy for a user to customize and operate during testing.

SUMMARY

In concordance with the instant disclosure, a versatile electrical testing device that is capable of being used with various systems having a variety of terminals and in a multitude of settings, prevents damage to the system being tested, and is easy for a user to customize and operate during testing, has surprisingly been discovered.

In one embodiment, an electrical testing device includes a housing having a base and a cover. The base and the cover define a cavity. The electrical testing device further includes an input connector and a plurality of output connectors in electrical communication with the input connector. A fuse is in electrical communication with the input connector and the plurality of output connectors. Each of the input connector and each output connector of the plurality of output connectors is adapted to connect to an interchangeable test lead. The input connector and each output connector of the plurality of output connectors is in electrical communication with an activation mechanism.

In another embodiment, an electrical testing kit includes an electrical testing device having a housing including a base and a cover. The base and the cover define a cavity. The electrical testing device further includes an input connector and a plurality of output connectors in electrical communication with the input connector. A fuse is in electrical communication with the input connector and the plurality of output connectors. Each of the input connector and each output connector of the plurality of output connectors is in electrical communication with a separate activation mechanism. The kit further includes a plurality of interchangeable test leads and a plurality of interchangeable test lead attachments.

In a further embodiment, a method of testing a system includes providing an electrical testing kit. The electrical testing kit includes an electrical testing device having a housing defining a cavity, an input connector in electrical communication with a plurality of output connectors, and a fuse in electrical communication with the input connector and the plurality of output connectors, wherein the input connector and each output connector of the plurality of output connectors is in electrical communication with a separate activation mechanism. The electrical testing device further includes a plurality of interchangeable test leads and a plurality of interchangeable test lead attachments. The method further includes identifying a system for testing, evaluating the system, selecting a testing combination including at least three of the electrical testing device, at least one test lead of the plurality of interchangeable test leads, and at least one test lead attachment of the plurality of interchangeable test lead attachments, connecting the selected testing combination to the system, and testing the system using the selected testing combination.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a front elevational view of an electrical testing device according to one embodiment of the present disclosure;

FIG. 2 is a top perspective view of the electrical testing device shown in FIG. 1;

DETAILED DESCRIPTION

Figure 4:
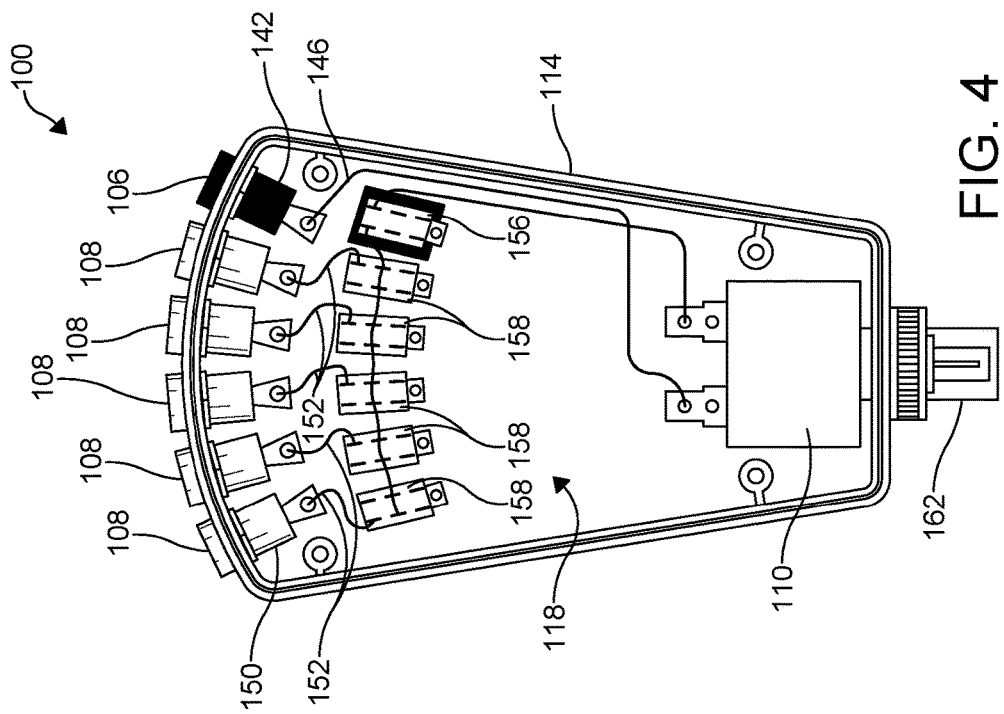
FIG. 4 is a rear elevational view of the cover of the electrical testing device of FIG. 1, the electrical testing device shown with the base removed.

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. Regarding methods disclosed, the order of the steps presented is exemplary in nature, and thus, the order of the steps can be different in various embodiments, including where certain steps can be simultaneously performed, unless expressly stated otherwise. "A" and "an" as used herein indicate "at least one" of the item is present; a plurality of such items may be present, when possible. Except where otherwise expressly indicated, all numerical quantities in this description are to be understood as modified by the word "about" and all geometric and spatial descriptors are to be understood as modified by the word "substantially" in describing the broadest scope of the technology. "About" when applied to numerical values indicates that the calculation or the measurement allows some slight imprecision in the value (with some approach to exactness in the value; approximately or reasonably close to the value; nearly). If, for some reason, the imprecision provided by "about" and/or "substantially" is not otherwise understood in the art with this ordinary meaning, then "about" and/or "substantially" as used herein indicates at least variations that may arise from ordinary methods of measuring or using such parameters.

All documents, including patents, patent applications, and scientific literature cited in this detailed description are incorporated herein by reference, unless otherwise expressly indicated. Where any conflict or ambiguity may exist between a document incorporated by reference and this detailed description, the present detailed description controls.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components, or process steps, the present technology also specifically includes embodiments consisting of, or consisting essentially of, such materials, components, or process steps excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as amounts, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, 3-9, and so on.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

An electrical testing device 100 used to test and troubleshoot a system 102 according to various embodiments of the present disclosure is shown in FIGS. 1-7. The device 100 includes a housing 104, an input connector 106, a plurality of output connectors 108, and a fuse 110.

With reference to FIGS. 1-4, the housing 104 includes a base 112 and a cover 114 in certain embodiments. The cover 114 may be permanently connected to, semi-permanently affixed to, or removably engaged with the base 112, as desired by one skilled in the art. As non-limiting examples, the cover 114 may be semi-permanently affixed to the base 112 using one or more screws 116 or a combination of one or more hinges with a locking mechanism (not shown). Alternatively, the cover 114 may slidingly engage with the base using a lip received by a groove (not shown). The base 112 and the cover 114 define a cavity 118.

The housing 104 may be made from any durable material such as plastic, silicone, or rubber. In certain embodiments, the housing 104 may be made from material that is easy to grip, lightweight, and not electrically conductive. Any desirable shape, size, and thickness may be selected by a skilled artisan for the housing 104. In certain embodiments, a first width 120 at a top end 122 of the electrical testing device 100 may be greater than a second width 124 at a bottom end 126 of the electrical testing device 100 such that the electrical testing device 100 is comfortable and more ergonomic to hold during use. The shape of the housing 104 may include grooves or grips (not shown) for fingers in certain embodiments, as desired.

Figure 3:
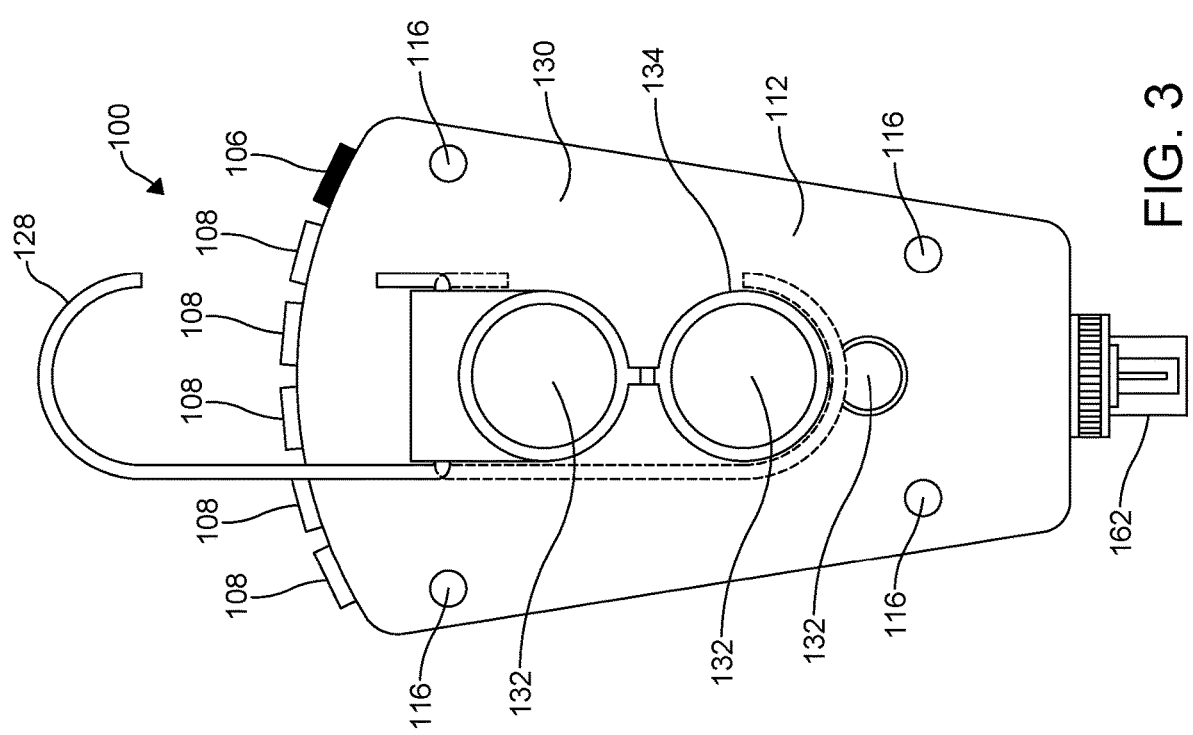
FIG. 3 is a rear elevational view of the electrical testing device shown in FIG. 1.
Figure 5:
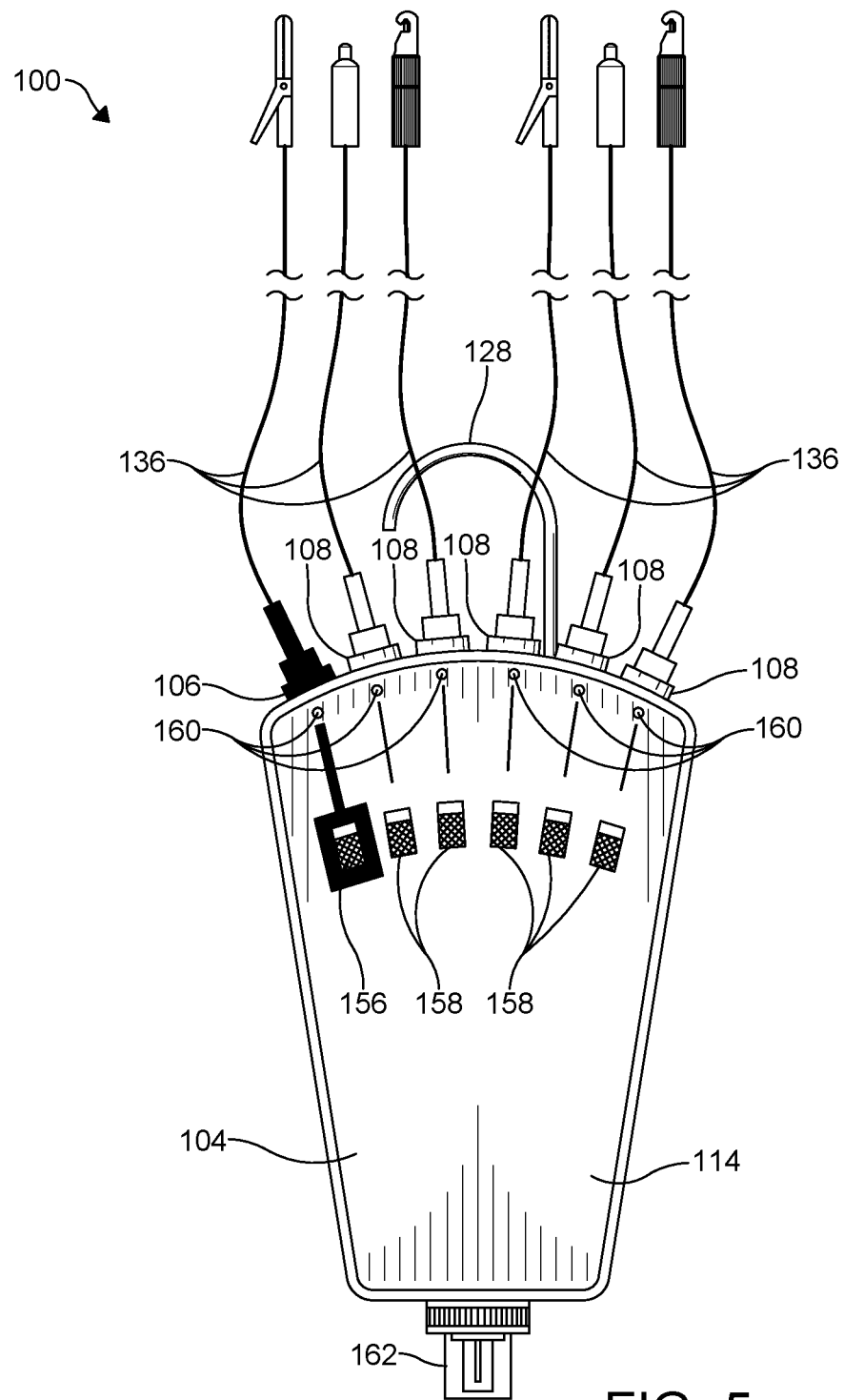
FIG. 5 is a front elevational view of the electrical testing device of FIG. 1, the electrical testing device shown in combination with a plurality of interchangeable test leads.
Figure 6:
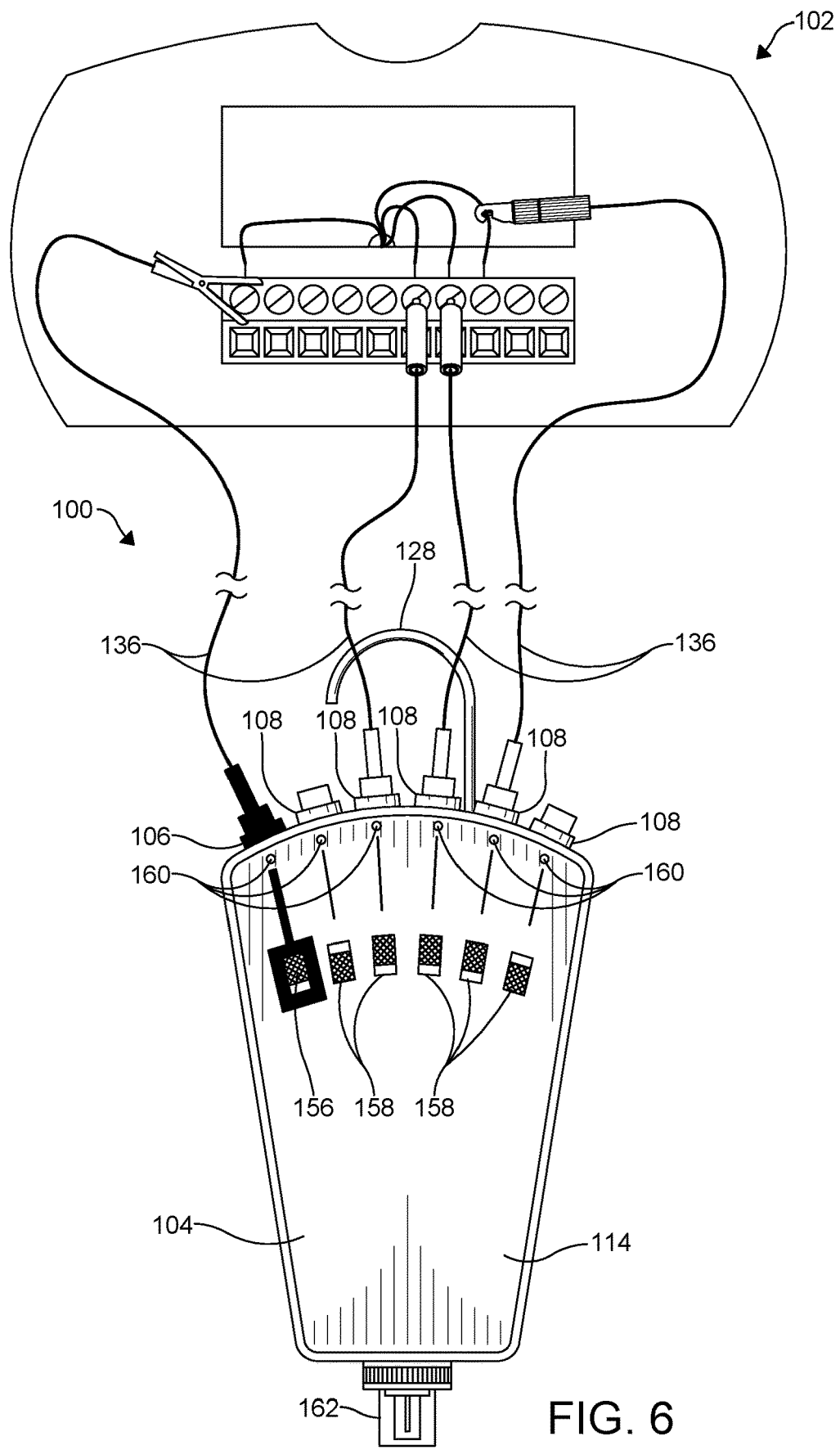
FIG. 6 is a front elevational view of the electrical testing device of FIG. 1, the electrical testing device shown in use with a plurality of interchangeable test leads connected to a system.
Figure 7:
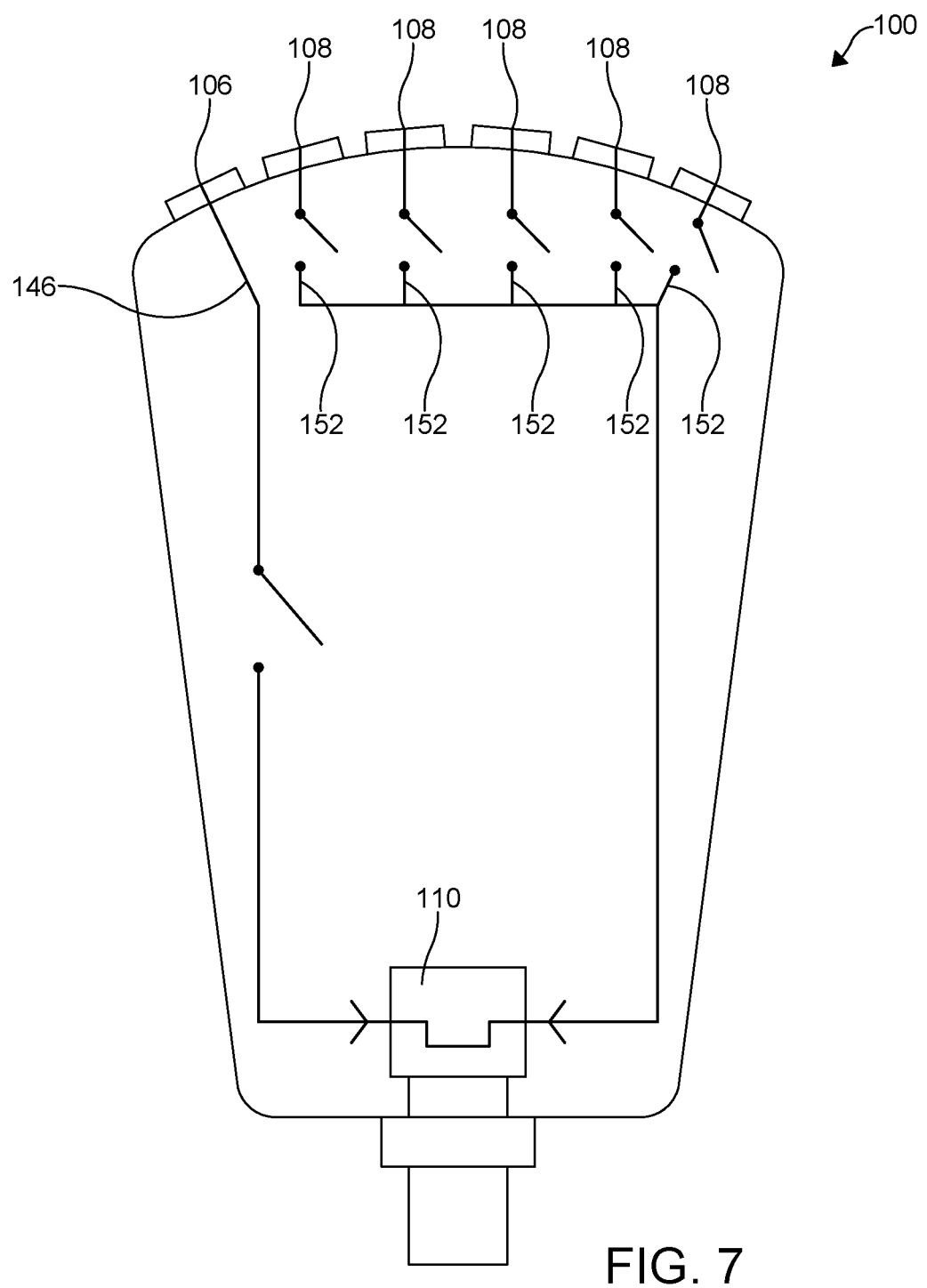
FIG. 7 is a schematic view of the electrical testing device shown in FIG. 1.
Figure 8:
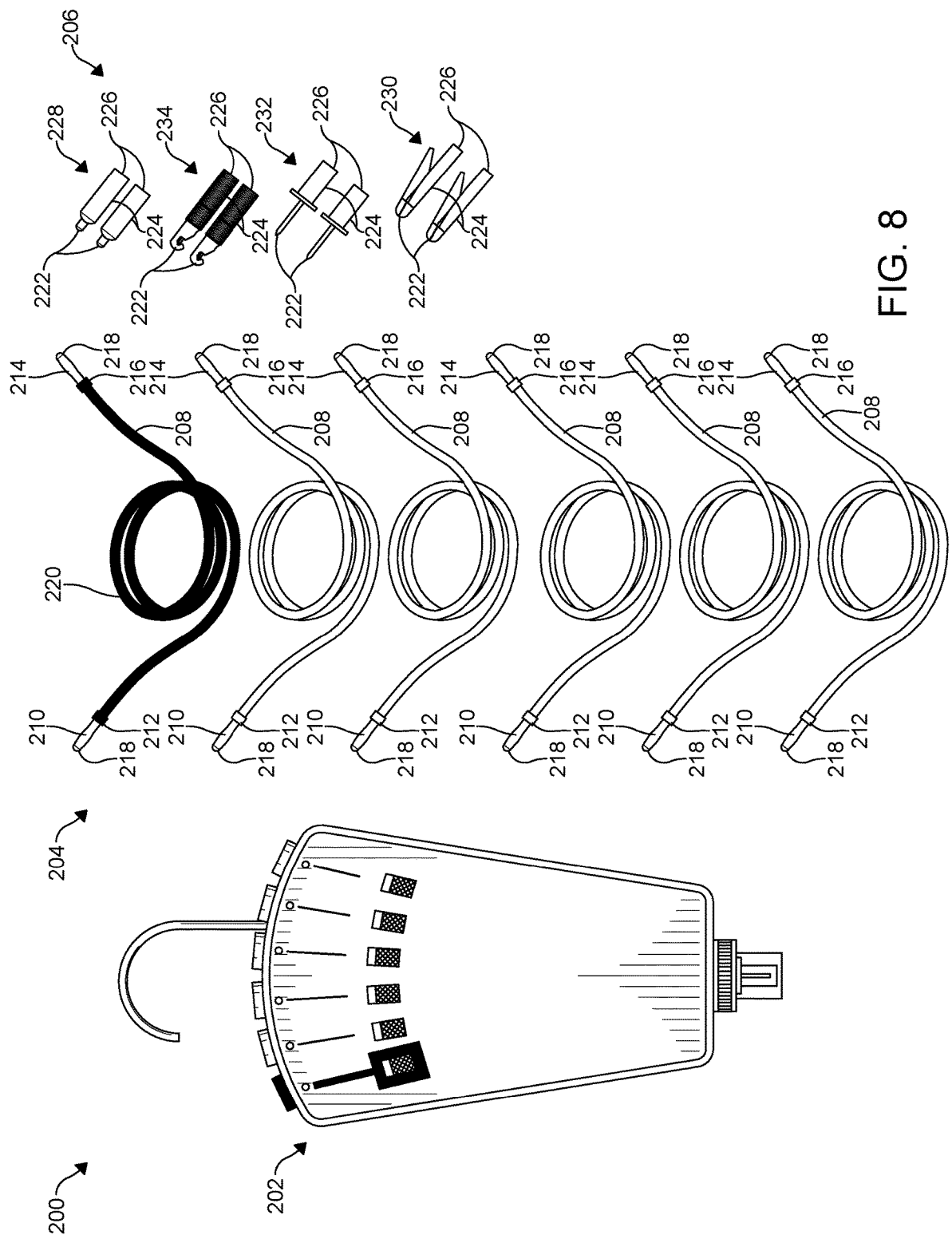
FIG. 8 is a front elevational view of an electrical testing kit according to another embodiment of the present disclosure.

Referring now to FIG. 3, in certain embodiments, a hook 128 is disposed on the housing 104. In certain embodiments, the hook 128 is disposed on a bottom surface 130 of the base 112 of the housing 104. The hook 128 may be permanently affixed to the housing 104 in a set position, or moveably connected such that the hook 128 can rotate, slide, or move in any other desirable way with respect to the housing 104. In a most particular embodiment, as shown in FIG. 3, the hook 128 is rotatably affixed to the base 112 such that during use the hook 128 extends upwardly above the housing 104 allowing the electrical testing device 100 to hang from a fixture on or near the system 102 being tested. The hook 128 can conveniently rotate to a position adjacent the bottom surface 130 of the base 112. In certain embodiments, the hook 128 may be stored in a recessed channel (not shown) disposed in the housing 104. The hook 128 may be made from any suitable material, for example, plastic or metal, as desired, and may include one or more components capable of changing shape or extending in length during use.

At least one magnet 132 may be disposed on the housing 104 of the device. In certain embodiments, the at least one magnet 132 may be disposed on the bottom surface 130 of the base 112 allowing the electrical testing device 100 to removably connect with and affix to a magnetic surface, for example, on or near the system 102, during use. As non-limiting examples, the at least one magnet 132 may be disposed in one or more recesses (not shown) and be flush with the bottom surface 130 of the base 112, or the at least one magnet may be disposed in a rim 134 extending outwardly away from the housing 104, as shown in FIG. 3. The at least one magnet 132 may be permanently or removably affixed to the housing 104 using glue, friction fit, or any other connecting means, as desired. The at least one magnet 132 may be any shape and size, as determined by one skilled in the art. In a most particular embodiment, the hook 128 may be made from a magnetic material and may be disposed adjacent to or over top of the at least one magnet 132, thereby holding the hook 128 in a secure location.

The input connector 106 is an electrical connector that may be integral with the housing 104 or removably or permanently disposed through an opening in the housing 104, as desired, and is adapted to receive an interchangeable test lead 136 during use. In certain embodiments, the interchangeable test lead 136 may be permanently affixed to the input connector 106. A first end 138 of the input connector 106 may be flush with an outer surface 140 of the housing 104 or may extend outwardly from the housing 104, as shown in FIG. 1. A second end 142 of the input connector 106, in certain embodiments, may be disposed in the cavity 118 of the electrical testing device 100. In certain embodiments, the input connector 106 may include a female connector 144 adapted to receive a male connector. However, a person skilled in the art may select an input connector having male, female, or other connectors, as desired. In a most particular embodiment, the input connector 106 includes a female banana socket adapted to receive a male banana plug. However, any connector type may be used such as quick connectors, pin connectors, molex connectors, spade connectors, and magnetic connectors, as non-limiting examples. The input connector 106 may be designated as such using a specific color, size, or other unique identifier, as desired by a person skilled in the art.

The input connector 106 is in electrical communication with a power input wire 146. The power input wire 146 may be made from any desirable conductive material such as cooper or aluminum, as non-limiting examples, and may be a low-voltage wire according to certain embodiments. As a non-limiting example, the power input wire 146 may be adapted to receive 24-volts. In certain embodiments, the power input wire 146 may be surrounded by an insulating material (not shown), such as a nonconductive plastic coating, for example, as desired. The power input wire 146 may be electrically connected to the input connector 106 using soldering, crimping, binding posts, screw terminals, or any other appropriate means, as determined by one skilled in the art.

The plurality of output connectors 108 are electrical connectors that may be integral with the housing 104 or removably or permanently disposed through one or more openings in the housing 104, as desired, and are adapted to receive one or more interchangeable test leads 136 during use. A first end 148 of each output connector of the plurality of output connectors 108 may be flush with the outer surface 140 of the housing 104 or may extend outwardly from the housing 104, as shown in FIG. 1. A second end 150 of each output connector of the plurality of output connectors 108, in certain embodiments, may be disposed in the cavity 118 of the electrical testing device 100. In certain embodiments, each output connector of the plurality of output connectors 108 may include a female connector 144 adapted to receive a male connector. However, a person skilled in the art may select a connector having male, female, or other connector components, as desired. In a most particular embodiment, each output connector of the plurality of output connectors 108 is a female banana socket adapted to receive a male banana plug. However, any connector type may be used such as quick connectors, pin connectors, molex connectors, spade connectors, and magnetic connectors, as non-limiting examples. Each output connector of the plurality of output connectors 108 may be identical to one another or different, as determined by a person skilled in the art.

In certain embodiments, each output connector of the plurality of output connectors 108 is in electrical communication with the power input wire 146 either directly or indirectly. In certain embodiments, a plurality of output wires 152 connect each output connector of the plurality of output connectors 108 to the power input wire 146, as shown in FIG. 4 and in the schematic view shown in FIG. 7. Each output wire of the plurality of output wires 152 may be made from any desirable conductive material such as cooper or aluminum, as non-limiting examples, and may be a low-voltage wire according to certain embodiments. As a non-limiting example, each output wire of the plurality of output wires 152 may be adapted to receive 24-volts. Each output wire of the plurality of output wires 152 may be surrounded by an insulating material (not shown), such as a nonconductive plastic coating, for example, as desired. Each output wire of the plurality of output wires 152 may be electrically connected to each output connector of the plurality of output connectors 108 using soldering, crimping, binding posts, screw terminals, or any other appropriate means, as determined by one skilled in the art.

The input connector 106 and each output connector of the plurality of output connectors 108 may be in electrical communication with at least one activation mechanism 154. The at least one activation mechanism 154 may be a toggle switch, a rocker switch, a push button, or any other appropriate activation mechanism 154, as determined by a person of skill in the art, and may be integral with the housing 104 of the electrical testing device 100 or permanently or removably disposed therein. The at least one activation mechanism 154 may be activated manually, or remotely using an app, a wireless remote, or Bluetooth technology according to various embodiments of the present disclosure.

In a most particular embodiment, each of the input connector 106 and each output connector of the plurality of output connectors 108 is connected to a separate activation mechanism 154, as shown in FIGS. 2 and 4, such that the input connector 106 and each output connector of the plurality of output connectors 108 may be activated and deactivated independent of one another. In certain embodiments, the power input wire 146 is in electrical communication with a power input activation mechanism 156 and each output wire of the plurality of output wires 152 is in electrical communication with a separate output activation mechanism 158, as shown in FIG. 2. The power input wire 146 and each output wire of the plurality of output wires 152 may be electrically connected to the power input activation mechanism 156 and each output activation mechanism 158, respectively, by soldering, crimping, binding posts, screw terminals, or any other appropriate means, as determined by one skilled in the art.

In a most particular embodiment, the electrical testing device 100 includes a plurality of lights 160, as shown in FIGS. 1, 2, 5, and 6. In certain embodiments, each light of the plurality of lights 160 corresponds with one of the input connector 106 and each output connector of the plurality of output connectors 108, allowing a user to determine when an electrical current is present during use. A skilled artisan may use any suitable light, for example, an LED light. In certain embodiments, at least one LCD or other type of display screen (not shown) may be included that is capable of displaying additional information about the system 102 being tested such as voltage and amps, as non-limiting examples. In certain embodiments, an adjustable dial may be included that capable of acting as a control relay with a time delay.

In certain embodiments, the fuse 110 is partially or completely disposed in the cavity 118 of the housing 104. The fuse 110 may be permanently or removably connected to the housing 104. The fuse 110 is in electrical communication with the input connector 106 and each output connector of the plurality of output connectors 108. In a most particular embodiment, the fuse 110 is in electrical communication with the input connector 106 and each output connector of the plurality of output connectors 108 using the power input wire 146. As non-limiting examples, the fuse 110 may be a manual, rewireable, cartridge, striker, switch, or any other suitable fuse. In a most particular embodiment, the fuse 110 is a manual reset, pop-out fuse 110. However, any suitable fuse 110 may be selected for use by a person of skill in the art. As shown in FIG. 4, according to certain embodiments, a manual reset element 162 of the fuse 110 may be disposed outside of the housing 104 of the electrical testing device 100 such that the fuse 110 may be reset as needed. In a most particular embodiment, the fuse 110 is one of a 3-amp fuse and a 5-amp fuse. However, any suitable fuse 110 may be selected by a skilled artisan.

In another embodiment of the present disclosure, an electrical testing kit 200 is used to test and troubleshoot a system 102, as shown in FIGS. 8-11. The electrical testing kit 200 includes an electrical testing device 202 according to various embodiments of the present disclosure, a plurality of interchangeable test leads 204, and a plurality of interchangeable test lead attachments 206. Each test lead of the plurality of interchangeable test leads 204 is adapted for use in combination with the electrical testing device 202 or separately and independently of the electrical testing device 202. In certain embodiments, a case (not shown) may be included with the electrical testing kit 200 to house all of the components when not in use.

Each test lead of the plurality of interchangeable test leads 204 is adapted to facilitate testing of various electrical components of the system 102 being tested. In certain embodiments, each test lead of the plurality of interchangeable test leads 204 includes an electrically conductive wire (not shown) made from any desirable conductive material such as cooper or aluminum, as non-limiting examples, and an insulating material 208 surrounding the wire. The insulating material 208 may be a nonconductive plastic coating, as a non-limiting example, or any other suitable nonconductive material. Each test lead of the plurality of interchangeable test leads 204 includes a first lead electrical connector 210 disposed at a first end 212, and a second lead electrical connector 214 disposed at a second end 216. As a non-limiting example, an 18 AWG wire may be used.

In certain embodiments, each of the first lead electrical connector 210 and the second lead electrical connector 214 may include a male connector 218 adapted to be received by a female connector. However, a person skilled in the art may select a first lead electrical connector 210 and a second lead electrical connector 214 having male, female, or other connectors, as desired. In a most particular embodiment, each of first lead electrical connector 210 and the second lead electrical connector 214 is a male banana plug adapted to be received by a female banana socket. However, any connector type may be used such as quick connectors, pin connectors, molex connectors, spade connectors, or magnetic connectors as non-limiting examples.

Each test lead of the plurality of interchangeable test leads 204 may be separately identified using a specific color, size, or other unique identifier, as desired by a person skilled in the art. Alternatively, in certain embodiments, each test lead of the plurality of interchangeable test leads 204 may be identical. In yet another embodiment, a power input test lead 220 may be identified using a specific color, size, or other unique identifier, as desired by a person skilled in the art. In certain embodiments, the power input test lead 220 may be permanently affixed to the electrical testing device 202. Each test lead of the plurality of interchangeable test leads 204 may be extendable in length. Alternatively, each test lead of the plurality of interchangeable test leads 204 may be uniform in length or have varying lengths, according to various embodiments. In certain embodiments, one or more lead extensions (not shown) may be provided. In certain embodiments, one or more test leads of the plurality of interchangeable test leads 204 may be fixed to the electrical testing device 202.

Each test lead attachment of the plurality of interchangeable test lead attachments 206 is adapted to form an electrical connection between the system 102 being tested and at least one of a test lead of the plurality of interchangeable test leads 204 and the electrical testing device 202. In certain embodiments, each test lead attachment of the plurality of interchangeable test lead attachments 206 includes an electrically conductive surface 222 made from any desirable conductive material such as cooper or aluminum, as non-limiting examples, and an insulating material 224 surrounding the electrically conductive surface 222. The insulating material 224 may be a nonconductive plastic coating, as a non-limiting example, or any other suitable nonconductive material, as desired. Each test lead attachment of the plurality of interchangeable test lead attachments 206 includes a lead attachment electrical connector 226 in electrical communication with the electrically conductive surface 222. Each test lead attachment of the plurality of interchangeable test lead attachments 206 included in the electrical testing kit 200 may be identical, or the electrical testing kit 200 may include a variety of different interchangeable test lead attachments 206. As non-limiting examples, the plurality of interchangeable test lead attachments 206 may include one or more magnetic tips 228, alligator clamps 230, probe tips 232, insulation piercing tips 234, spring style loaded hinge clamps, and any other suitable interchangeable test lead attachments 206, as shown in FIGS. 8 and 10A-D. Each interchangeable test lead attachment of the plurality of interchangeable test lead attachments 206 may be the same color or may be a different color, as desired.

According to certain embodiments, each lead attachment electrical connector 226 may include a female connector 238 adapted to receive a male connector. However, a person skilled in the art may select a lead attachment electrical connector 226 having male, female, or other connectors, as desired. In a most particular embodiment, each lead attachment electrical connector 226 is a female banana socket adapted to receive a male banana plug. However, any connector type may be used such as quick connectors, pin connectors, molex connectors, spade connectors, and magnetic connectors, as non-limiting examples.

Figure 9:
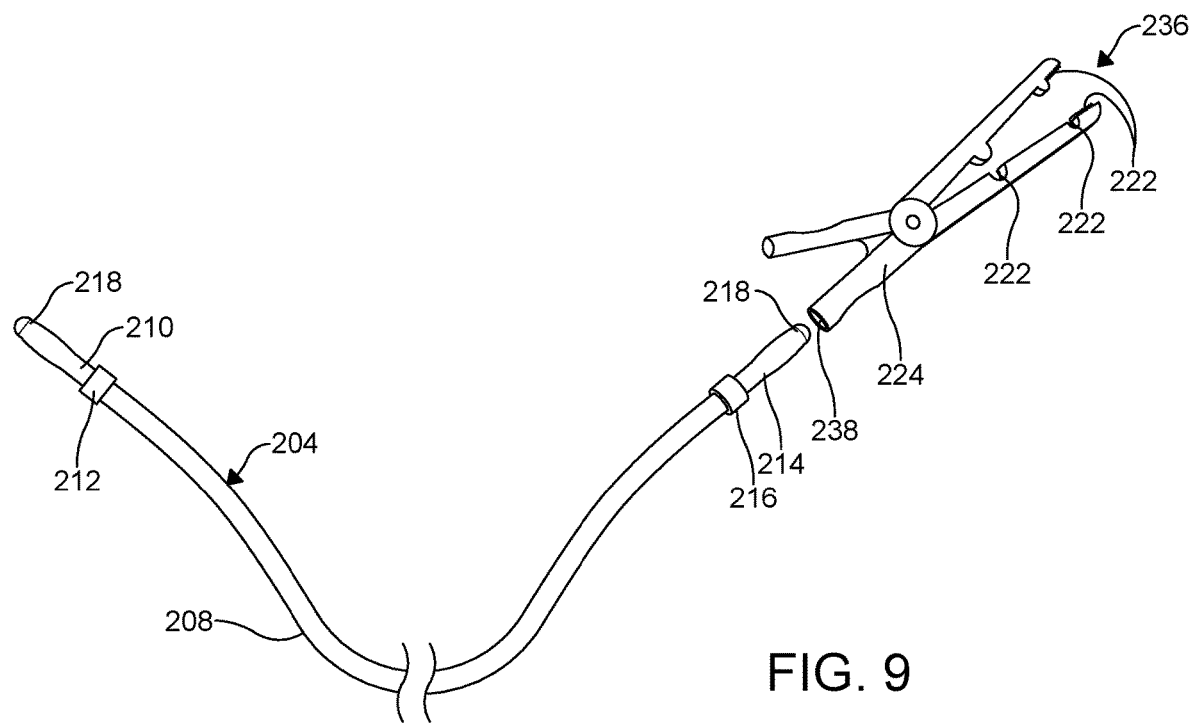
FIG. 9 is a front perspective view of a test lead and a test lead attachment included in the electrical testing kit of FIG. 8, the test lead disconnected from the test lead attachment.
Figure 10A:
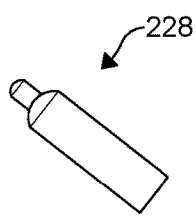
FIG. 10A is a front elevational view of a magnetic tip test lead attachment of the electrical testing kit of FIG. 8.
Figure 10B:
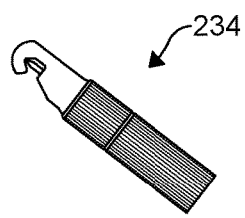
FIG. 10B is a front elevational view of an insulation piercing test lead attachment of the electrical testing kit of FIG. 8.
Figure 10C:
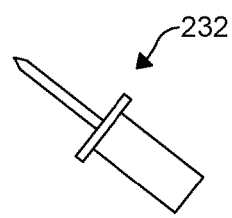
FIG. 10C is a front elevational view of a probe tip test lead attachment of the electrical testing kit of FIG. 8.
Figure 10D:
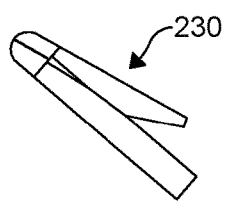
FIG. 10D is a front elevational view of an alligator clamp test lead attachment of the electrical testing kit of FIG. 8.

One embodiment of an interchangeable test lead 204, shown in FIG. 9, includes male connectors 218 at first and second ends 210, 216. A first lead electrical connector 210 of the interchangeable test lead 204 can attach to the input connector 106 or one output connector of the plurality of output connectors 108. A hybrid interchangeable test lead attachment 236 including an alligator clamp and at least one insulation piercing needle, can attach to the second lead electrical connector 214. The hybrid interchangeable test lead attachment 236 can be attached to various points and components of the system 102 being tested.

Figure 11:
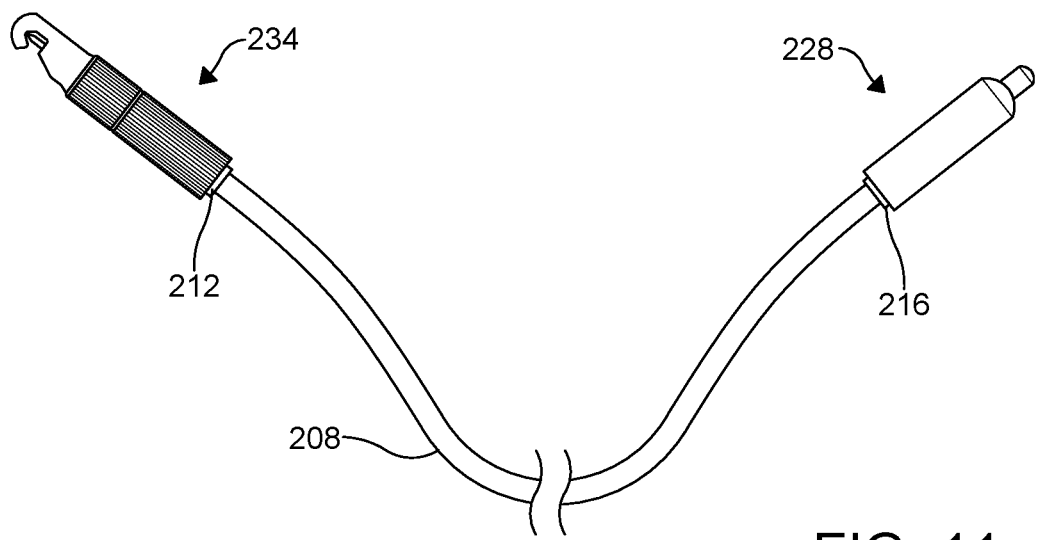
FIG. 11 is a front elevational view of a test lead connected to two test lead attachments included in the electrical testing kit of FIG. 8.

Other ways of configuring the interchangeable test leads 204 include mixing and matching various combinations of the same or different interchangeable test lead attachments 206. An example is shown in FIG. 11, where an insulation piercing tip 234 is attached to a first end 212 of an interchangeable test lead 204 and a magnetic tip 228 is attached to a second end 216 the interchangeable test lead 204. Interchangeable test leads 204 can therefore be configured or adapted to complement attachment to the input connector 106, each output connector of the plurality of output connectors 108, as well as various points and components of the system 102 being tested.

Figure 12:
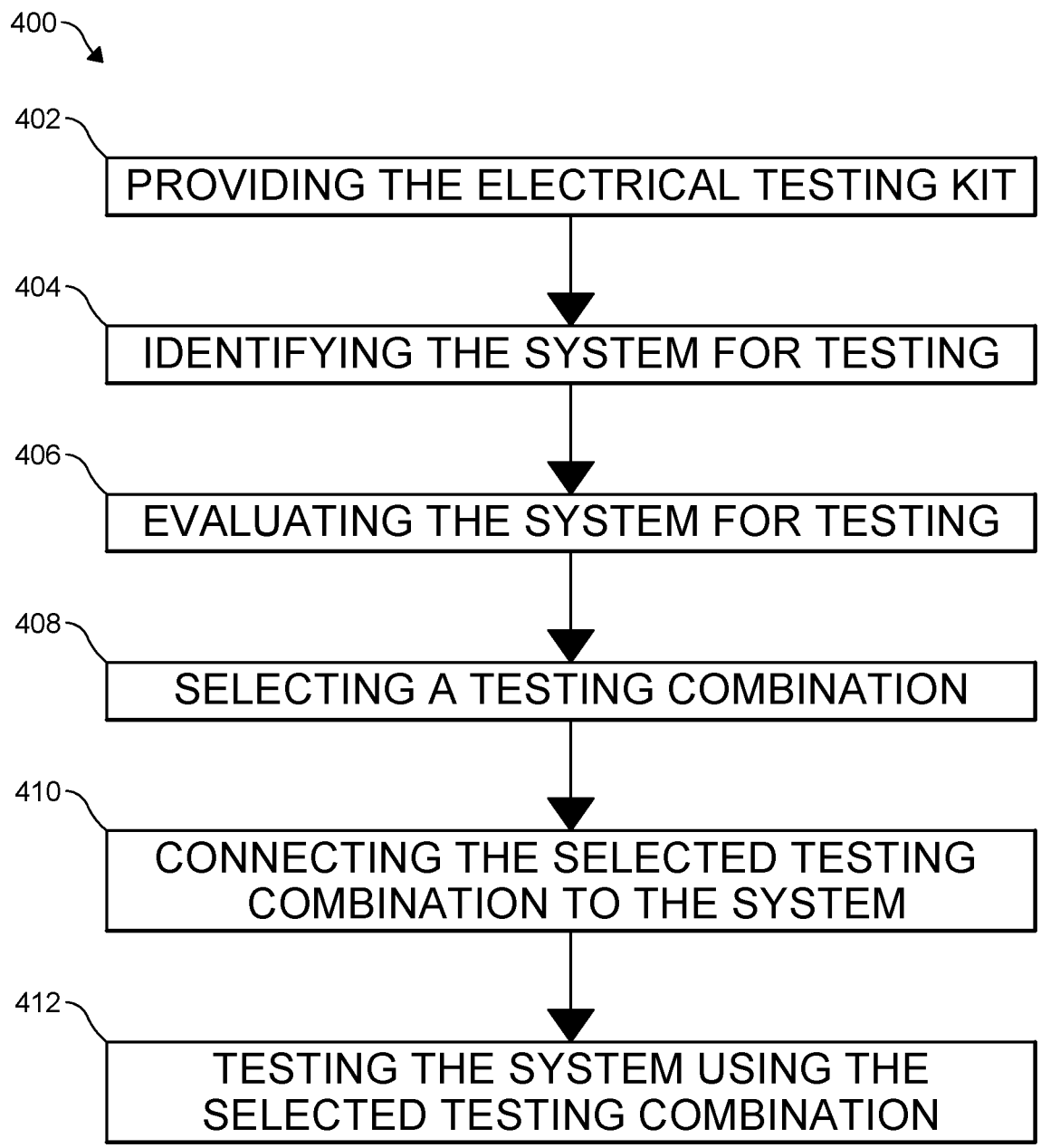
FIG. 12 is a method of testing a system using an electrical testing kit according to another embodiment of the present disclosure.

A method 400 of testing the system 102 using the electrical testing kit 200 is shown in FIG. 12. The method 400 of testing the system 102 includes a first step 402 of providing the electrical testing kit 200 according to various embodiments of the present disclosure. In a second step 404, a user identifies the system 102 for testing. In a third step 406, the user evaluates the system 102 for testing. The method further includes the additional steps 408, 410 of selecting a testing combination including at least three of the electrical testing device 100, 202, at least one test lead of the plurality of interchangeable test leads 204, and at least one interchangeable test lead attachment of the plurality of interchangeable test lead attachments 206, and connecting the selected testing combination to the system 102. A final step 412 is testing the system 102 using the selected testing combination.

The method 400 for testing the system 102 using the electrical testing kit 200 may further include repeating steps 406, 408, 410, 412 in order to test each component of the system 102. Various components may require using different testing combinations due to different terminals involved, accessibility of the terminals, and other variables. Useful testing combinations include, but are not limited to, the electrical testing device 100, 202 used in combination with a test lead 204 and a test lead attachment 206, and a test lead 204 used in combination with two test lead attachments 206. According to various embodiments of the present disclosure, the user may place the electrical testing device 100, 202 in a secure location using the hook 128 or the at least one magnet 132, as desired.

Advantageously, the electrical testing device 100, 202, the electrical testing kit 200, and the method 400 of testing a system 102 can be used in a multitude of settings and can be customized based on the system 102, or even the specific components of the system 102, being tested. Specifically, the variety of interchangeable test leads 204 that work with and independent of the electrical testing device 100, 202, and the variety of interchangeable test lead attachments 206 allow a user to assemble an electrical testing device 100, 202 that is specific to individual systems 102, as needed. Additionally, the separate activation mechanisms 154 that correspond with each of the input connector 106 and each output connector of the plurality of output connectors 108 allow a user to activate and deactivate each one individually. Additionally, multi-systems 102, a plurality of systems 102, and a plurality of components that are part of one system 102 may be tested simultaneously, as desired.

It should be appreciated that the various components of the electrical testing device 100, 202 prevent damage and short circuiting of the system 102 being tested. As non-limiting examples, the ergonomic design of the housing 104, the hook 128, the at least one magnet 132, the fuse 110, the interchangeable test leads 204, and the interchangeable test lead attachments 206 allow a user to set up a testing area, as well as the electrical testing device 100, 202, in an optimal way. In certain embodiments, the manual reset, pop-out fuse 110 prevents damage when there is a direct electrical short in the system 102 being tested.

It should also be appreciated that various components of the electrical testing kit 200 may be replaceable, such as the plurality of interchangeable test leads 204 and the plurality of interchangeable test lead attachments 206. Alternatively, the electrical testing device 100, 202 and the electrical testing kit 200 may work with universal test leads 204, alligator clamps 230, magnetic tips 228, probe tips 232, insulation piercing tips 234, hybrid interchangeable test lead attachments 236, and other test lead attachments not provided. In certain embodiments, the electrical testing kit may be adapted for use in the automotive industry.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions and methods can be made within the scope of the present technology, with substantially similar results.

What is claimed is:

1. An electrical testing device, comprising:
   a housing having a base and a cover, the base and the cover defining a cavity;
   an input connector;
   a plurality of output connectors in electrical communication with the input connector; and
   a fuse in electrical communication with the input connector and the plurality of output connectors;
   wherein each of the input connector and each output connector of the plurality of output connectors is adapted to connect to an interchangeable test lead;
   wherein the input connector and each output connector of the plurality of output connectors are in electrical communication with an activation mechanism;
   wherein the input connector and the plurality of output connectors are arranged on a top end of the electrical testing device; and
   wherein the fuse is a manual reset, pop-out fuse arranged on a bottom end of the electrical testing device and the input connector is operably connected to the plurality of output connectors using a power input wire, the power input wire running from the input connector at the top end of the electrical testing device to the fuse at the bottom end of the electrical testing device and on to a plurality of output wires, each output wire operably connected to one of the output connectors at the top end of the electrical testing device.

2. The electrical testing device of claim 1, wherein the input connector and each output connector of the plurality of output connectors are a female banana socket adapted to receive a male banana plug.

3. The electrical testing device of claim 1, wherein the interchangeable test lead is adapted to connect to an interchangeable test lead attachment.

4. The electrical testing device of claim 1, wherein the housing includes one of:
   at least one magnet disposed on an outer surface the housing; and
   at least one hook connected to the housing.

5. The electrical testing device of claim 1, wherein each of the input connector and each output connector of the plurality of output connectors is in electrical communication with a separate activation mechanism.

6. The electrical testing device of claim 1, wherein the activation mechanism is one of a toggle switch, a rocker switch, and a push button.

7. The electrical testing device of claim 1, wherein each of the input connector and each output connector of the plurality of output connectors is adapted to connect to a separate interchangeable test lead.

8. The electrical testing device of claim 1, wherein the fuse is one of a 3-amp fuse and a 5-amp fuse.

9. The electrical testing device of claim 1, wherein a plurality of load wires electrically connect the power input wire to the plurality of output connectors.

10. The electrical testing device of claim 1, wherein the electrical testing device includes a plurality of lights and each light of the plurality of lights corresponds with one of the input connector and each output connector of the plurality of output connectors, thereby allowing a user to determine when an electrical current is present during use.

11. The electrical testing device of claim 1, wherein the electrical testing device includes a plurality of lights and each light of the plurality of lights corresponds with one of the input connector and each output connector of the plurality of output connectors, thereby allowing a user to determine when an electrical current is present during use, and each light is positioned adjacent to one of the input connector and the output connectors.

12. The electrical testing device of claim 11, wherein each of the input connector and each output connector of the plurality of output connectors is in electrical communication with a separate activation mechanism.

13. An electrical testing kit, comprising:
   an electrical testing device including a housing having a base and a cover, the base and the cover defining a cavity, an input connector in electrical communication with a plurality of output connectors, and a fuse in electrical communication with the input connector and the plurality of output connectors, wherein each of the input connector and each output connector of the plurality of output connectors is adapted to connect to an interchangeable test lead, wherein each of the input connector and each output connector of the plurality of output connectors is in electrical communication with a separate activation mechanism, wherein the input connector and the plurality of output connectors are arranged on a top end of the electrical testing device; and wherein the fuse is a manual reset, pop-out fuse arranged on a bottom end of the electrical testing device and the input connector is operably connected to the plurality of output connectors using a power input wire, the power input wire running from the input connector at the top end of the electrical testing device to the fuse at the bottom end of the electrical testing device and on to a plurality of output wires, each output wire operably connected to one of the output connectors at the top end of the electrical testing device;

a plurality of interchangeable test leads; and a plurality of interchangeable test lead attachments.

14. The electrical testing kit of claim 13, wherein each test lead of the plurality of interchangeable test leads has a first end and a second end each having a male connector, and wherein each test lead attachment of the plurality of interchangeable test lead attachments has a first end having a female connector.

15. The electrical testing kit of claim 13, wherein the plurality of interchangeable test lead attachments includes at least one of a magnetic tip, an alligator clamp, a probe tip, and an insulation piercing tip.

16. The electrical testing kit of claim 13, wherein a combination of at least one test lead of the plurality of interchangeable test leads and at least two test lead attachments of the plurality of interchangeable test lead attachments may be used independently of the electrical testing device.

17. A method of testing a system, the method comprising the steps of:

providing an electrical testing kit, the electrical testing kit including:

an electrical testing device having a housing defining a cavity, an input connector in electrical communication with a plurality of output connectors, and a fuse in electrical communication with the input connector and the plurality of output connectors, wherein each of the input connector and each output connector of the plurality of output connectors is adapted to connect to an interchangeable test lead, wherein the input connector and each output connector of the plurality of output connectors is in electrical communication with a separate activation mechanism, wherein the input connector and the plurality of output connectors are arranged on a top end of the electrical testing device; and wherein the fuse is a manual reset, pop-out fuse arranged on a bottom end of the electrical testing device and the input connector is operably connected to the plurality of output connectors using a power input wire, the power input wire running from the input connector at the top end of the electrical testing device to the fuse at the bottom end of the electrical testing device and on to a plurality of output wires, each output wire operably connected to one of the output connectors at the top end of the electrical testing device;

a plurality of interchangeable test leads; and a plurality of interchangeable test lead attachments;

identifying a system for testing;

evaluating the system;

selecting a testing combination including at least three of the electrical testing device, at least one test lead of the plurality of interchangeable test leads, and at least one test lead attachment of the plurality of interchangeable test lead attachments;

connecting the selected testing combination to the system; and testing the system using the selected testing combination.

\* \* \* \* \*